United States Patent

Winkel

[15] 3,688,209

[45] Aug. 29, 1972

[54] DIFFERENCE AMPLIFIER

[72] Inventor: Jan Te Winkel, Emmasingel, Eindhoven, Netherlands

[73] Assignee: U.S. Philips Corporation, New York, N.Y.

[22] Filed: July 6, 1970

[21] Appl. No.: 52,442

[30] Foreign Application Priority Data

July 23, 1969 Netherlands..............6911359

[52] U.S. Cl.........................330/30 D, 330/69, 330/26
[51] Int. Cl...................................................H03f 3/68
[58] Field of Search..........................330/26, 30 D, 69

[56] References Cited

UNITED STATES PATENTS 3,473,137 10/1969 Stern...........................330/30

*Primary Examiner*—Alfred L. Brody
*Attorney*—Frank R. Trifari

[57] ABSTRACT

A Darlington difference amplifier in which the offset voltage, produced by the difference between the current amplification factors of the output transistors, is reduced by such a feedback that substantially no signal voltage appears across the base-emitter junctions of the input transistors.

8 Claims, 7 Drawing Figures

INVENTOR.
JAN TE WINKEL
BY
[signature]
AGENT

JAN TE WINKEL INVENTOR.
BY
AGENT

INVENTOR.
JAN TE WINKEL
BY
Frank R. Trifari
AGENT

DIFFERENCE AMPLIFIER

This invention relates to a difference amplifier comprising two pairs of transistors, the base electrodes of the first transistor pair being connected to the input terminals and the emitter electrodes thereof being connected to the base electrodes of the second transistor pair. The emitter electrodes of the second transistor pair are connected to each other and via a current source to one terminal of the supply source and the collector electrodes are connected via individual impedances to the other terminal of the supply source, across which impedances the output voltage is derived.

In difference amplifiers having only two junction transistors the input impedance is normally comparatively low, because for obtaining a sufficiently high output signal the steady-current adjustment of the transistors has to be high so that the base current of the transistors will also be high. In order to obtain a higher amplification factor and a higher input impedance it is common practice to use a combination of two transistor pairs. The difference amplifier then comprises two stages each having an input transistor and an output transistor adjusted in the linear working range. Since the input transistors only have to supply the base current of the output transistors, the base current of the input transistors may be accordingly low so that a higher input impedance is obtained.

The invention is engaged with the fact that in such a circuit arrangement the difference between the current amplification factors of the two output transistors plays an important part because said difference, in spite of modern manufacturing methods, may be 10 to 20 percent and is, in addition, dependent upon temperature and time. Said difference becomes manifest in the collector currents of the input transistors. As a result thereof the base-emitter voltages of the input transistors will be different when the output transistors have equal collector currents and when an input signal is absent. This difference between the base-emitter voltages of the two input transistors, together with a small difference, if any, between the base-emitter voltages of the output transistors, determines the lack of symmetry of the difference amplifier. This lack of symmetry is represented by the voltage which has to be applied to the input terminals of the difference amplifier for obtaining zero output voltage. In a difference amplifier comprising only two transistors, only the latter component must be taken into account. Owing to the aforesaid fairly high difference between the current amplification factors of the output transistors the lack of symmetry of the two-stage amplifier, termed hereinafter a Darlington difference amplifier, is a factor 10 to 20 higher than the lack of symmetry of a difference amplifier comprising only two transistors. The gain in input impedance and amplification factor is therefore achieved at the expense of a greater lack of symmetry.

An object of the invention is to drastically reduce the lack of symmetry of the Darlington difference amplifier.

The invention is characterized in that the collector electrode of each of the transistors of the first pair is connected via an impedance to a point of constant potential, the voltage across said impedance being applied to the base of a feedback transistor whose emitter electrode is connected to the emitter electrode of the feedback transistor of the opposite stage of the difference amplifier and via a current source to a terminal of the supply source. The collector electrode of each of these feedback transistors is connected directly or via an inverter to the emitter electrode of one of the transistors of the first pair so that the signal voltage at the base-emitter junctions of the transistors of the first pair is considerably reduced. The feedback is arranged so that the input transistors practically need not supply signal current, this signal current being supplied for the major part via the feedback path to the output transistors. Therefore, substantially no signal voltage will appear at the base-emitter junctions of the input transistors. Substantially the complete signal appears at the base-emitter junctions of the output transistors so that the collector currents of these transistors will not exhibit discrepancies due to the difference between the current amplification factors of these output transistors.

The desired feedback is obtained by connecting the collector of each of the input transistors via an impedance to a point of constant potential and by applying the voltage across each said impedance to the base of an additional transistor. For the sake of simplifying the integrated circuit it is preferred to choose as an impedance the series combination of a number of diodes. The additional transistor may be of the same or of the opposite conductivity type with respect to the transistors of the difference amplifier. The emitter of said transistor is connected to the emitter of the additional transistor of the opposite stage of the difference amplifier and via a current source to one of the terminals of the supply source, said terminal being chosen in accordance with the conductivity type of the additional transistors. The collector of the additional transistor is connected directly or via an inverter to the base of one of the output transistors in a manner such that the signal current is supplied with the correct polarity to this output transistor.

If, for example, the transistors of the difference amplifier are of the npn-type, the collector current of the input transistor concerned will increase in the case of a positive input voltage. The voltage drop across the collector impedance then also increases so that the base of the additional transistor will be at a lower potential. If this transistor is of the pnp-type, the collector current of said transistor will increase. This increase in collector current of the additional transistor depends, of course, upon the value of the collector impedance of the input transistor and the direct-current setting of the additional transistor. This collector current of the additional transistor is added to the emitter current of the input transistor and the sum determines the base current of the associated output transistor. If both the collector impedance of the input transistor and the direct-current setting of the additional transistor are chosen to be sufficiently high, a small variation in collector current of the input transistor will produce a great variation in collector current of the additional transistor and hence a great variation in the base current of the associated output transistor. The signal voltage will therefore appear for the major part at the base-emitter junction of the output transistor. As matter of course, in this arrangement in which the additional transistor is of the opposite conductivity type to that of the transistors of the difference amplifier and the collector of said transistor is directly connected to the base of the associated output transistor, the steady-current setting of said additional transistor has to be lower than the direct base current of the output transistor.

The additional transistor may alternatively be of the npn-type. In this case with a positive input voltage the collector current of this transistor will decrease. If the collector of this transistor is directly connected to the base of the associated output transistor, the emitter current of the input transistor will be reduced by the collector current of the additional transistor. Since the latter contains the signal current with negative polarity, the base current of the output transistor will again contain the signal current with positive polarity. In this arrangement the input transistor has to supply in addition the direct current for the additional transistor. The direct input current will therefore be higher than in the first-mentioned case. It is furthermore necessary to include a Zener diode in the connection between the collector of the input transistor and the base of the additional npn-transistor in order to ensure the desired potential difference between said electrodes.

In both cases the collector of the additional transistor may be connected via a known inverter to the base of the output transistor of the opposite stage of the difference amplifier instead of being connected to the base of the associated output transistor. The operation of these arrangements is other wise identical to that of the arrangements described in the foregoing.

The invention will now be described with reference to the accompanying drawings, in which.

Figure 3A:
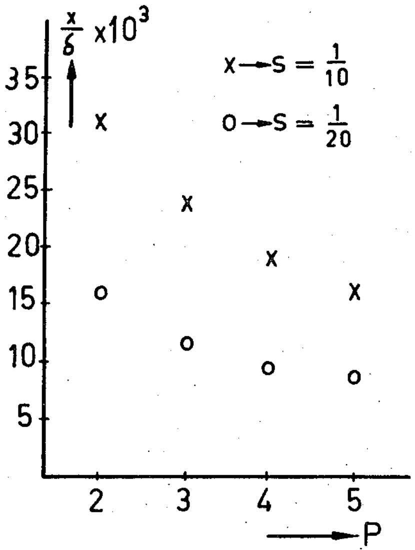
Figure 3B:
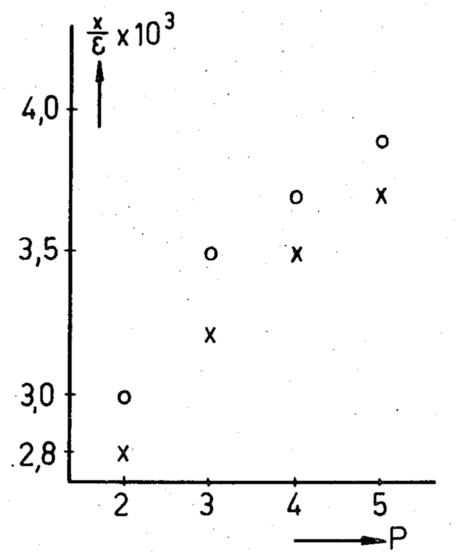

FIG. 3*a* and 3*b* illustrate the suppression of the error voltage as a function of a few parameters.

Figure 4:
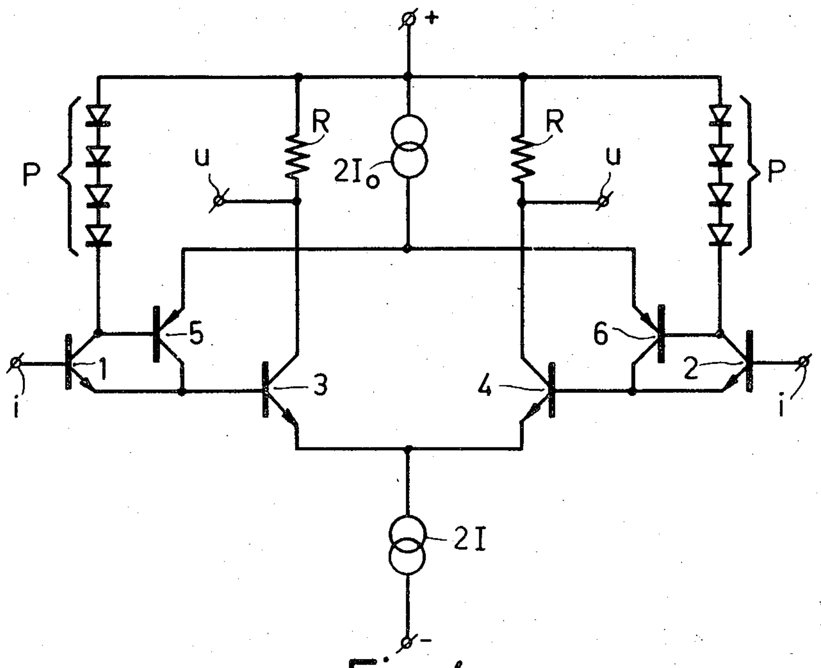
Figure 5:
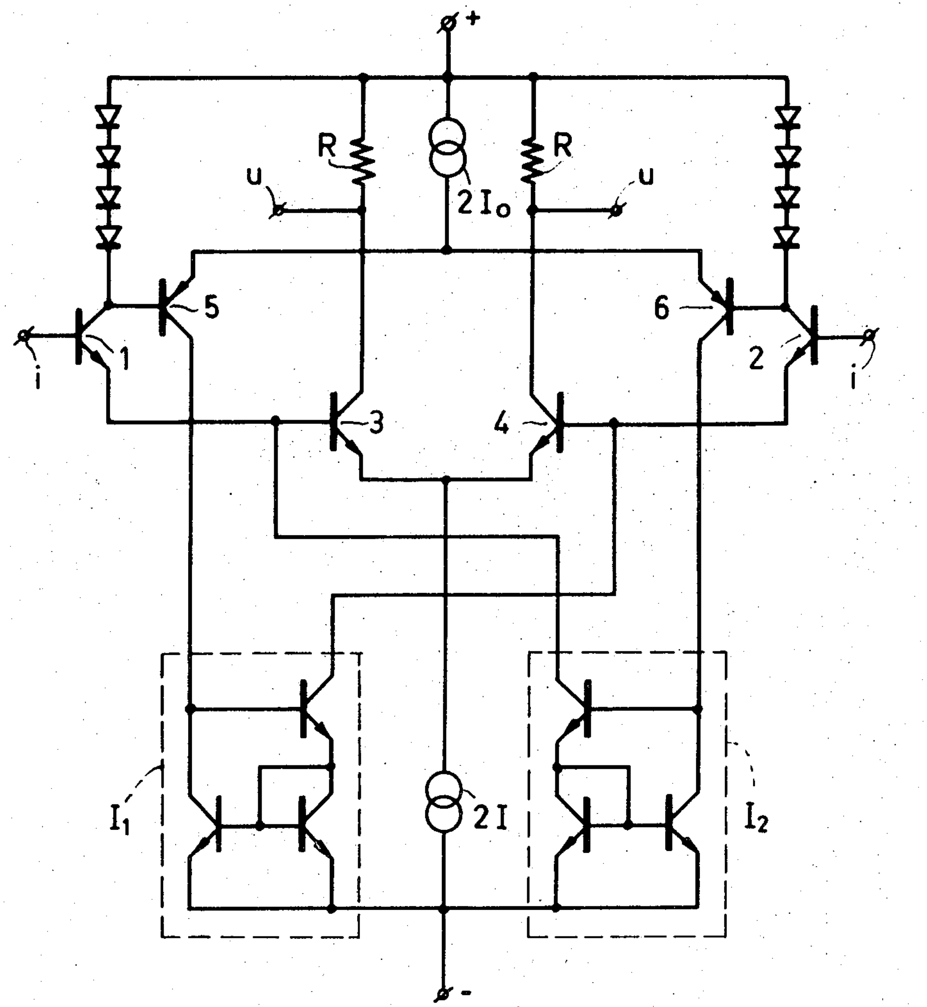

FIG. 4 shows a second and FIG. 5 a third embodiment of the arrangement in accordance with the invention.

Figure 2:
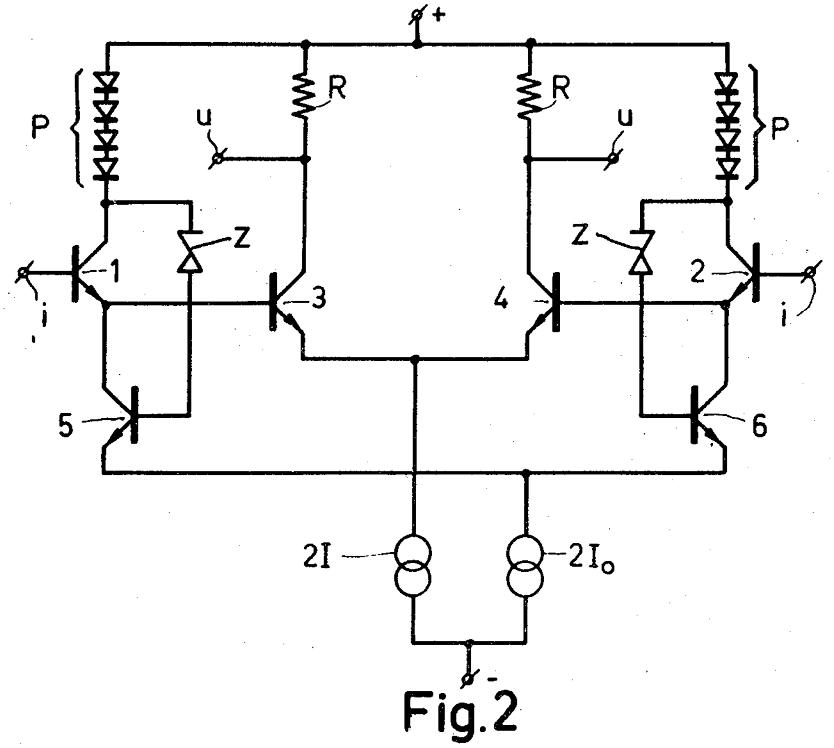
FIG. 2 shows a first embodiment of the circuit arrangement in accordance with the invention.
Figure 6:
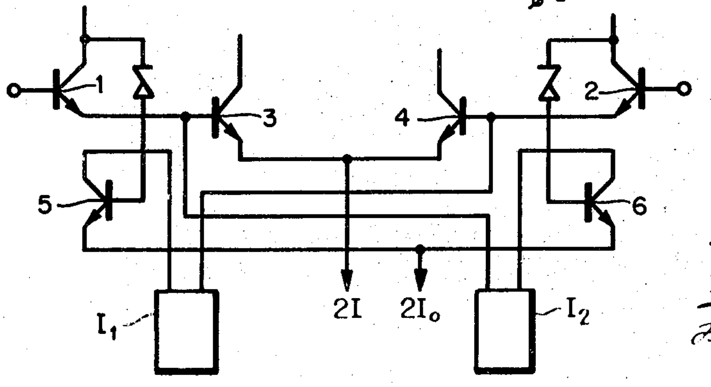

FIG. 6 shows a modification of the arrangement shown in FIG. 2.

Figure 1:
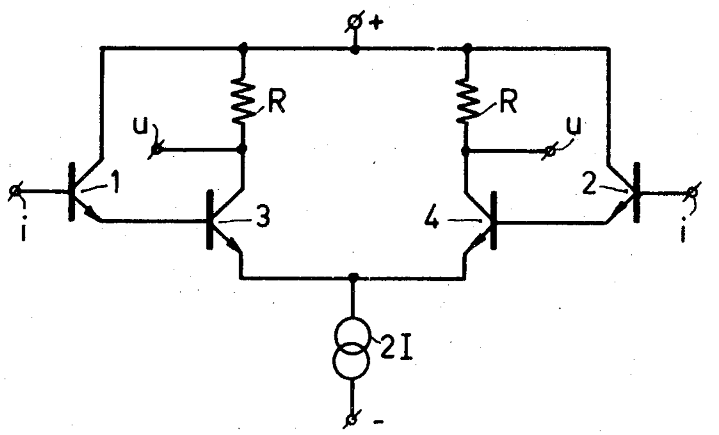
FIG. 1 shows the known Darlington difference amplifier.

The difference amplifier shown in FIG. 1 comprises two stages having input junction transistors 1 and 2 and output junction transistors 3 and 4. The emitter electrodes of transistors 3 and 4 are connected to each other and via a current source 2I to one terminal of the supply source, whereas their collector electrodes, which form in addition the output terminals *u*, are connected via impedances R to the other terminal of the supply source, to which terminal are furthermore connected the collector electrodes of transistors 1 and 2. The input terminals *i* are formed by the base electrodes of transistors 1 and 2.

In the state in which the collector currents of the transistors 3 and 4 are equal to each other and the voltage between the output terminals *u* is zero, the base-emitter voltage of these transistors will be substantially equal to each other. If the current amplification factor of transistor 3 exceeds that of transistor 4, the collector current of transistor 1 is lower than that of transistor 2 so that also the base-emitter voltage of transistor 1 is lower than that of transistor 2. In order to obtain the situation described in the absence of an input signal, an additional voltage has to be applied between the input terminals, said voltage represents the lack of symmetry and has to be equal to the difference between the base-emitter voltages.

In the state in which no signal at all is applied to the input (terminals *i* are interconnected) the currents of the transistors 3 and 4 and 1 and 2 are not equal to each other, the difference being such that in the present example the collector current of transistor 3 exceeds that of transistor 4, whereas the collector current of transistor 1 is lower than that of transistor 2. In a relative sense the differences are equal to each other with opposite polarities and are also equal to half the difference between the relative current amplification factors These properties of the arrangement ensue from the condition that in the absence of any input signal the differences between the base-emitter voltages of the transistors 3 and 4 and of 1, 2 in an absolute sense should be equal to each other and have opposite polarities.

The difference amplifier shown in FIG. 2 comprises three transistor pairs of the same conductivity type, i.e. the input transistors 1 and 2, the output transistors 3 and 4 and the additional transistors 5 and 6. The input voltage is applied between the base electrodes of the input transistors 1 and 2, whereas the emitters of transistors 1 and 2 are connected to the bases of the output transistors 3 and 4, respectively, and to the collectors of the additional transistors 5 and 6, respectively. The collectors of the input transistors 1 and 2 are connected via a number of diodes P driven in the pass direction to a terminal of the supply source and via a Zener diode Z connected in the reverse direction to the bases of the additional transistors 5 and 6. The Zener diodes serve herein only to ensure the required potential difference between the collector of the input transistor concerned and the base of the associated feedback transistor. It should be noted that the Zener diodes may be replaced by the series combination of a plurality of diodes without the need for further means.

For explaining the operation of the arrangement the output current will be calculated.

The steady-current setting of the output transistors is designated by I and that of the additional transistors by Ic. The current amplification factors of the output transistors 3 and 4 are $\beta/1-\delta$ and $\beta/1+\delta$ respectively, $\beta$ designating the desired current amplification factor and $\delta$ the difference. The current amplification factors of the additional transistors 5 and 6 are $n\,\beta/1-\epsilon$ and $n\,\beta/1+\epsilon$ respectively, wherein $n\,\beta$ represents the desired value and $\epsilon$ the difference. In an integrated circuit it will be preferred to use transistors having equal current amplification factors so that in that case $n = 1$. The bases of the input transistors 1 and 2 receive an input voltage $+\Delta\ (kT)/\ q$ and $-\Delta\ (kT)/\ /q$ respectively. The number of diodes in the collector circuit of each of the input transistors is assumed to be p.

Since the arrangement is symmetrical, the collector current of transistor 3 is $I(1+x)$ and that of transistor 4 $I(1-x)$. The base-emitter voltage of 3 is thus raised by $x\ (kT)\ /q$ and since the signal voltage $+\Delta(kT)\ /q$ has to appear between the base of transistor 1 and the emitter of transistor 3, the base-emitter voltage of transistor 1 is raised by $(\Delta - x)\ (kT)\ /q$. The base current of transistor 3 is equal to $$\frac{I}{\beta}\left(1+x\right)(1-\delta)\simeq\frac{I}{\beta}(1+x-\delta)$$

and the emitter current of transistor 1 is:

$$\left(\frac{I}{\beta}+Io\right)(1+\Delta-x)$$

which has to be equal to the sum of the base current of transistor 3 and the collector current of the feedback transistor 5, which is Io(1 − y). As a first equation it is found that:

$$\left(\frac{I}{\beta}+Io\right)(1+\Delta-x)=\frac{I}{\beta}(1+x-\delta)+Io(1-y) \qquad (1)$$

The base voltage of transistor 5 is determined by the voltage drop across the diodes in the collector circuit of transistor 1. The current passing through said diodes is equal to the sum of the collector current of transistor 1 and the base current of transistor 5. The relative variation of said current through the diodes multiplied by the number of diodes indicates the absolute voltage variation across said diodes, which has to be equal to $y(kT)\ )/q$, i.e. the variation of the base voltage of transistor 5. As a second equation there is thus found:

$$\frac{\left(\frac{I}{\beta}+Io\right)(\Delta-x)-\frac{Io}{n\beta}(y+\epsilon)}{\frac{I}{\beta}+Io+\frac{Io}{n\beta}}\,p\frac{kT}{q}=y\frac{kT}{q} \qquad (2)$$

The combination of the equations (1) and (2) gives the following expression for $x$:

$$x=\Delta\left\{1-\frac{s+\frac{p+1}{n\beta}\frac{s}{s+1}}{p+2s+1+\frac{2s+1}{s+1}\frac{p+1}{n\beta}}\right\}+\delta\frac{s\left(1+\frac{1}{s+1}\frac{p+1}{n\beta}\right)}{p+2s+1+\frac{2s+1}{s+1}\frac{p+1}{n\beta}}-\epsilon\frac{1}{n\beta(s+1)}\frac{p}{p+2s+1+\frac{2s+1}{s+1}\frac{p+1}{n\beta}} \text{ with } s=\frac{I}{\beta Io}$$

($kT$ If $p$ is chosen not to be too high, $s$ is chosen to be small and the current amplification factor $\beta$ is chosen to be high, it may be written:

$$x=\Delta\left\{1-\frac{s+\frac{p+1}{n\beta}\frac{s}{s+1}}{p+2s+1}\right\}+\delta\frac{s}{p+2s+1}-\epsilon\frac{p}{n\beta(s+1)(p+2s+1)}$$

By correct choice of the variables it can be ensured that the error voltages $\delta$ and $\epsilon$ are drastically suppressed. In this case $x$ is substantially equal to $\Delta$. Substantially the whole signal voltage then appears at the base-emitter junction of the output transistor. The direct input current has increased since the input transistor also has to supply the steady current for the feedback transistor. The differential input resistance has, however, also increased because the input transistor need substantially not supply signal current.

FIGS. 3a and 3b illustrate for two values of $s$, the relationship between $x$ and the error voltages $\delta$ and $\epsilon$ as a function of the number of diodes in the collector circuits of the input transistors, it being assumed that all transistors have a value $\beta$ of 200. It will be apparent from the characteristic curves that the suppression of the error voltages is already very satisfactory with a restricted number of diodes.

FIG. 4 shows a difference amplifier in which the transistors 1, 2, 3 and 4 are of the npn-type and the feedback transistors 5 and 6 are of the pnp-type. The emitters of these transistors are connected in this case via a current source to the positive terminal of the supply source. The collector of transistor 5 is connected to the base of transistor 3 and the collector of transistor 6 is connected to the base of transistor 4. The collector of the input transistor 1 and 2 respectively, is again connected to the base of transistor 5 and 6, respectively, there being, however, no need for using a Zener diode. The emitter currents of the input transistors 1 and 2 are raised by the collector currents of the transistors 5 and 6. Otherwise the operation of the arrangement is substantially identical to that of FIG. 2. However, the conditions for obtaining a satisfactory suppression of the error voltage are different. From the Figure it will be seen that the steady-current setting of the feed-back transistor has to be lower than the direct base current of the output transistors, i.e. s> 1. The direct input current of the difference amplifier will be lower than that of the arrangement shown in FIG. 2 since the transistors 5 and 6 supply part of the direct base current of the output transistors. The input impedance of the arrangement of FIG. 4 may therefore be higher than that of the arrangement of FIG. 2, said impedance being, however, still dependent upon the value of $s$. The arrangement shown in FIG. 4 has the disadvantage that the setting of the steady current of the feedback transistors 5 and 6 is more critical than in the arrangement of FIG. 2 and that the possibility of suppressing the error voltage is reduced.

FIG. 5 shows a difference amplifier in which the transistors 5 and 6 are also of the pnp-type. However the collector electrodes are not directly connected to the base electrodes of the output transistors 3 and 4. Instead the collector of transistor 5 is connected through a known inverter to the base of transistor 4 and the collector of transistor 6 is connected through a similar inverter to the base of transistor 3. The inverter does not affect the value of the current but inverts the polarity. The inverter may be formed by the arrangement represented by the blocks $I_1$ and $I_2$. This arrangement comprises three transistors of the same conductivity type, the collector-emitter paths of the first and the second transistors being traversed by the same current. The second transistor is connected as a diode, the base being connected to that of the third transistor. The emitter of the second and third transistors are connected to one of the supply terminals and the collector of the third transistor is connected to the base of the first transistor. The input and output-terminals are formed by the collectors of the third and the first transistors, respectively. A current passing through the collector of the third transistor is reproduced in the collector current of the first transistor. In the arrangement of FIG. 5 the operation is identical to that of FIG. 2.

It is of course also possible in the arrangement of FIG. 2 to connect the collector of each of the additional transistors 5 and 6 by means of an inverter $I_1$ and $I_2$ to the base of the output transistor 4 and 3 of the opposite stage of the difference amplifier, as shown shown FIG. 6. The diodes in the collector circuits of the input transistors may be replaced directly by resistors without any modification of the operation of the arrangement. In integrated circuits, however, it is useful to employ diodes.

As an alternative the collector circuits of the input transistors may include resistors instead of diodes, which resistors are not connected to a terminal of the supply source, but rather to a tapping of an output resistor in the opposite stage of the difference amplifier. By a correct choice of the ratio between the collector resistance of the input transistors and the resistance between the tapping of the output resistor and the supply source it can be ensured that substantially only a signal proportional to the difference between the current amplification factors of the output transistors is fed back and no signal voltage is fed back.

What is claimed is:

1. A difference amplifier adapted to be energized from a source of supply voltage comprising, a current source, two pairs of transistor, means connecting the base electrodes of the first transistor pair to the amplifier input terminals and the emitter electrodes thereof to the base electrodes of the second transistor pair, means connecting the emitter electrodes of the second pair of transistors to each other and via said current source to one terminal of the supply source, means connecting the collector electrodes of the second transistor pair via first and second impedance elements to the other terminal of the supply source, across which impedance elements the output voltage is derived, means connecting the collector electrode of each of the transistors of the first pair via third and fourth impedance elements, respectively, to a point of constant potential, first and second feedback transistors, means for applying the voltage across said third and fourth impedance elements to the base electrodes of said first and second feedback transistors, respectively, means connecting the emitter electrodes of the feedback transistors together and via a current source to a terminal of the supply source, means individually connecting the collector electrodes of the feedback transistors to respective ones of the emitter electrodes of the transistors of first pair in a manner so as to reduce the signal voltage across the base-emitter junction of the transistors of the first pair.

2. A difference amplifier as claimed in claim 1 characterized in that all of the transistors are of the same conductivity type and the collector of each of the feedback transistors is directly connected to the emitter of that transistor of the first pair to whose collector its base is connected.

3. A difference amplifier as claimed in claim 1 wherein the feedback transistors are of a conductivity type opposite to that of the transistors of the two pairs and the collector of each of the feedback transistors is connected through an inverter to the emitter of the input transistor of the opposite stage of the difference amplifier.

4. A difference amplifier as claimed in claim 1 wherein the feedback transistors are of a conductivity type opposite to that of the transistors of the two pairs and the collector of each of the feedback transistors is directly connected to the emitter of that input transistor to whose collector its base is connected.

5. A difference amplifier as claimed in claim 1 characterized in that all of the transistors are of the same conductivity type and the collector of each of the feedback transistors is connected through an inverter to the emitter of the input transistor of the opposite stage of the difference amplifier.

6. A difference amplifier as claimed in claim 1 wherein said means for applying the voltage across said third and fourth impedance elements to the base electrodes of the feedback transistors comprise first and second constant voltage elements, and wherein said means for connecting the emitter electrodes of the first transistor pair to the base electrodes of the second transistor pair and to the collector electrodes of the feedback transistors are arranged to effectively isolate the emitter electrodes of said first transistor pair from one another so that signals appearing at the input terminals are not cross-coupled between the emitter electrodes of said first transistor pair.

7. A difference amplifier as claimed in claim 1 wherein said third and fourth impedance elements each comprise one or more diode elements poled in the same direction as the transistors of the first pair.

8. A difference amplifier as claimed in claim 4 wherein said feedback transistors and said first transistor pair are connected in circuit so that the base currents of the second transistor pair are each composed of the sum of the collector currents of a feedback transistor and a transistor of the first transistor pair.

* * * * *

PO-1050
(5/69)

UNITED STATES PATENT OFFICE
CERTIFICATE OF CORRECTION

Patent No. 3,688,209 Dated August 29, 1972

Inventor(s) JAN TE WINKEL

It is certified that error appears in the above-identified patent and that said Letters Patent are hereby corrected as shown below:

col. 1, line 64, after "pair" insert -- (i.e. input transistors) --;

col. 3, line 48, after "having" insert -- a first pair of --;

line 49, before "output" insert -- a second pair of --;

line 57, cancel "formed by"; and insert -- connected to --;

col. 4, line 24, before "input" insert -- first pair of --; before "output" insert -- second pair of --;

line 32, cancel "driven" and insert -- connected --;

line 61, after "4" insert -- is --;

col. 6, line 5, change "value β" to -- β value --;

line 8, cancel "restricted" and insert -- limited --;

PO-1050
(5/69)

UNITED STATES PATENT OFFICE

CERTIFICATE OF CORRECTION

Patent No. 3,688,209 Dated August 29, 1972

Inventor(s) JAN TE WINKEL PAGE - 2

It is certified that error appears in the above-identified patent and that said Letters Patent are hereby corrected as shown below:

IN THE CLAIMS

Col. 7, line 26, change "transistor" to -- transistors --;

Col. 8, line 19, cancel "input";

line 20, after "transistor" insert -- of the first pair of transistors --;

Signed and sealed this 17th day April 19 73.

(SEAL)
Attest:

EDWARD M.FLETCHER,JR.
Attesting Officer

ROBERT GOTTSCHALK
Commissioner of Patents